(12) United States Patent
Elco et al.

(10) Patent No.: US 6,361,327 B1
(45) Date of Patent: Mar. 26, 2002

(54) MICROMACHINED SILICON BEAM INTERCONNECT

(75) Inventors: Richard A. Elco, Mechanicsburg; Timothy A. Lemke, Dillsburg, both of PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/379,516

(22) Filed: Aug. 23, 1999

(51) Int. Cl.$^7$ ............................ H01R 12/00; H05K 1/00
(52) U.S. Cl. ............................ 439/59; 439/65; 439/637
(58) Field of Search ............................ 439/59, 65, 637

(56) References Cited

U.S. PATENT DOCUMENTS

| | | | | |
|---|---|---|---|---|
| 5,345,364 A | * | 9/1994 | Biernath | 361/749 |
| 5,397,904 A | * | 3/1995 | Arney et al. | 257/66 |
| 5,709,773 A | | 1/1998 | Field et al. | 156/647.1 |
| 6,025,208 A | * | 2/2000 | Chui et al. | 438/50 |
| 6,072,190 A | * | 6/2000 | Watanabe et al. | 257/48 |
| 6,116,756 A | * | 9/2000 | Peeters et al. | 362/285 |
| 6,174,744 B1 | * | 1/2001 | Watanabe et al. | 438/14 |

OTHER PUBLICATIONS

Ehrfeld, et al., "Progress in deep–etch synchrotron radiation lithography," *J. Vac. Sci. Technol. B6(1)*, Jan./Feb. 1988, 178–182.
Akin, T. et al., "A Modular Micromachined High–Density Connector for Implantable Biomedical Systems," *IEEE*, 1996, 497–502 (no month).
Darden, B. V. et al., "The reliable optical card–edge (ROC) connector for avionics applications," *SPIE*, 1994, 2295, 230–235 (no month).
Hannoe, S. et al., "Electrical charateristics of micro mechanical contacts," *Microsystem Technol.*, 1996, 31–35 (no month).
Hong, S. et al., "Cantilver Beam Micro–Contacts in a Multi–Chip Interconnection System," *Seventh IEEE/CHMT International Electronic Manufacturing Technology Symposium*, San Francisco, CA, Sep. 25–27, 1989, 239–245.
Kang, I–B et al., "An assembly and interconnection technology for micromechanical structures using a anisotropic conductive film," *SPIE*, 1996, 2879, 280–287 (no month).
Kriz, J. et al., "Ohmic contacts to n–type polycrystalline SiC for high–temperature micromechanical applications," *Mat. Sci. Engineer.*, 1997, B46, 180–185 (no month).
Schiele, I. et al., "Micromechanical Relay with Electrostatic Actuation," *IEEE*, International Conference on Solid–State Sensors and Actuators, Chicago, Jun. 15–19, 1997, 1165–1168.

* cited by examiner

*Primary Examiner*—Brian Sircus
*Assistant Examiner*—Brian S. Webb
(74) *Attorney, Agent, or Firm*—Woodcock Washburn LLP

(57) ABSTRACT

An interconnect structure for connecting electrical components that includes a plurality of micromachined silicon cantilever beams. The cantilever beams are formed having a shape dictated by predetermined scaling rules that determine the mechanical and electrical properties of the cantilever beam. The cantilever beams are arranged in two generally parallel rows and are mounted to a dielectric material to form a recess between the rows. An electrical component may be inserted into the recess to create a contact force against the cantilever beams to place the component and the interconnect into electrical communication. Also, an electrical connector system may be constructed having a first electrical connector comprising a contact formed of metalized silicon and a base supporting the contact, and a second electrical connector mateable with the first electrical connector that comprises a contact formed of metalized silicon and a base supporting the contact. Further, a methods of reducing the pitch between adjacent contacts in an electrical connector and scaling an electrical connector so as to maintain a generally constant near end cross-talk and characteristic impedance are provided.

16 Claims, 3 Drawing Sheets

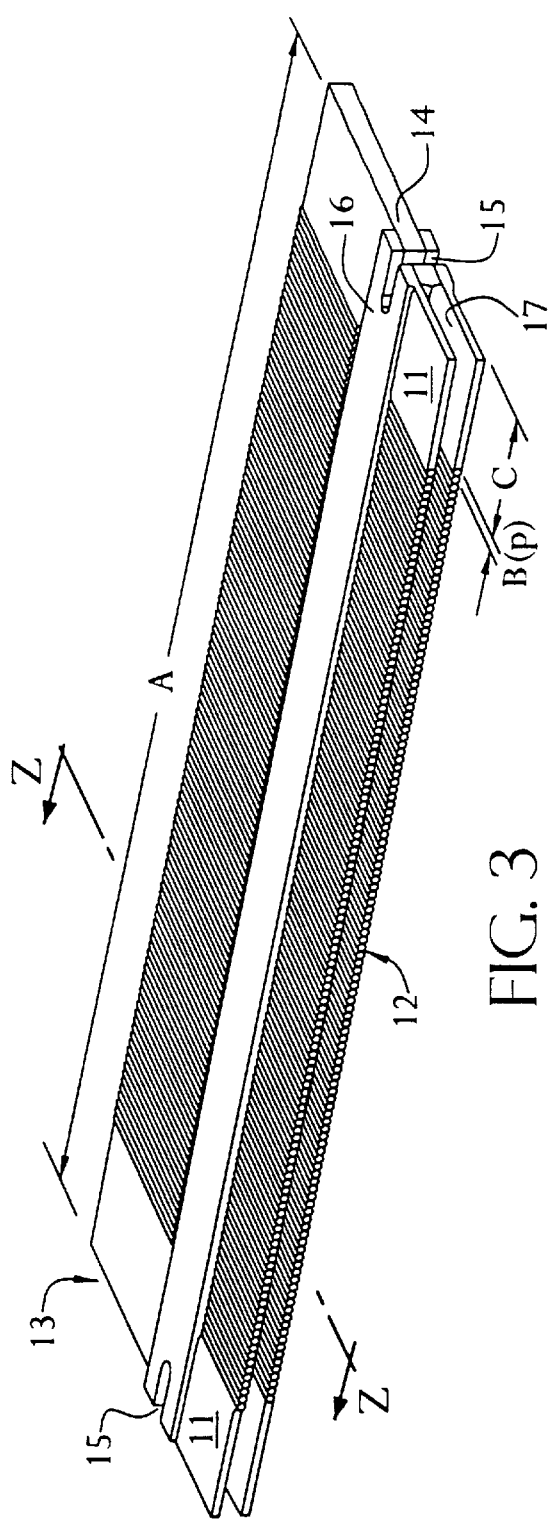

MICROMACHINED SILICON BEAM INTERCONNECT

FIELD OF THE INVENTION

This invention relates to electrical interconnects, and more particularly, to an interconnect structure utilizing silicon cantilever beams that are adapted to be received by a contact terminal of a complementary structure.

BACKGROUND OF THE INVENTION

In recent years, integrated circuits have become increasingly complex. These new complex integrated circuits have created problems for designers because they have a large number of pin-outs requiring a large number of connections to printed circuit boards, etc. In addition, these new complex integrated circuits are operating at ever-increasing clock speeds, which are approaching 1 GHz. Conventional interconnect technologies may not maintain pace with the rapid acceleration in complexity and speed of integrated circuits.

Conventional interconnect technologies complicate the design and manufacturing of electronic equipment such as integrated circuits by requiring such designs to account for component placement, heat generation, power loss, signal propagation delay, cross talk, switching noise and termination problems. Often new interconnect technologies overcome one problem while increasing the negative effects of another. Conventional interconnect technologies provide different approaches to interconnecting electronic components, and include: solder reflow to make permanent, low-ohmic connections; wiping contacts to make temporary, medium-ohmic connections; and filled adhesives to make permanent, medium to high ohmic connections. Each of these technologies has limitations in view of the improvements in electronic components such as integrated circuits.

Solder reflow techniques provide a metallic contact of moderate strength, but require the bonded surfaces and surrounding areas to be subjected to high heat. Thermal stresses induced by solder reflow tend to weaken or damage the components joined and therefore results in higher initial and long term failure rates. In addition, solder bonds are easily broken under moderate stress, and if the bonds are not formed under controlled conditions, they are subject to producing poor connections having high resistance and low mechanical durability.

Wiping action interconnect technology, such as that used by sockets, plugs, needle pins, etc., forms a temporary electrical interconnection to provide for remating of various components and assemblies. A problem with using wiping action technology is the persistent formation of oxides along a contacting surface, which increases contact resistance. In time, these oxides build up causing heat to be generated at the contact surface, causing connection failure and equipment failure. The sockets and connectors used in wiping action technology often use special metals, alloys, and other expensive materials suitable for maintaining a sliding connection. Further limiting these devices is that they often have interfering electrical properties due to their size, orientation on a circuit board, etc., which degrades signal propagation through the interconnect by introducing resistive, capacitive, and inductive components into the signal path. Additionally, wiper interconnects are highly unreliable in environments having excessive vibration, temperature extremes, and/or high levels of contamination exist.

Zero insertion force (ZIF) sockets are an improvement in the wiping action interconnect technology area, but their cost increases significantly as the number pin-outs or connection points increases. This cost increase has made component packages and the connectors used to form an electrical and/or mechanical interface between integrated circuits and assemblies in electronic products the most expensive portion of such products. An additional drawback is that component packages, connectors, sockets, plugs, etc. are also the bulkiest and heaviest portion of such products.

Filled adhesive technology is used to provide a binder and a conductive filling. The adhesives typically utilized are silver or gold. However, these materials are often unsuitable for most interconnect applications because they form medium to high ohmic connections.

Thus, in view of the above, there still remains a need for an improved interconnect structure that allows for higher densities of connection points to electronic equipment, while providing superior electrical performance and being easier to manufacture and produce. The present invention provides such a solution.

SUMMARY OF THE INVENTION

The present invention is directed to an interconnect structure for electronic equipment. According to the present invention, there is provided an interconnect structure adapted to receive an electrical component that includes a dielectric material and a plurality of cantilever beams secured to the dielectric material at a predetermined pitch. The plurality of cantilever beams are deflected by a contact force created when the cantilever beams receive the electrical component in order to place the cantilever beams in mechanical and electrical communication with the electrical component.

According to features of the invention, the cantilever beams maybe made from micromachined silicon and arranged in two generally parallel planes separated by the dielectric material to form a recessed region. A mounting structure having slots may be disposed on the top and bottom of the dielectric material. Each of the cantilever beams has a top surface, a side comprising first and second side surfaces, and a bottom surface. The bottom surface contacts a terminal pad of the electrical component when received by the interconnect structure. The first side surface is formed at a predetermine angle with respect to the top surface. Also, the cantilever beams may be formed having a sloped face at a free end thereof.

According to other features of the invention, design rules are provided to specify various mechanical and electrical constraints that are met to achieve mechanical tolerances and electrical performance as the pitch of the interconnect structure is varied. In particular, the lateral tolerances of the cantilever beams fix a minimum pitch and vertical tolerances of the plurality of cantilever beams fix a spring rate of the cantilever beams.

According to another aspect of the present invention, a method of reducing the pitch between adjacent contacts in an electrical connector is provided which comprises the steps of providing a contact with an extent that defines a volume; adjusting the extent of the contact; and maintaining the volume of the contact. The adjusting step may comprise adjusting the length and the height of the contact while maintaining the width of the contact. The adjusting step may alternately comprise adjusting the length and the width of the contact while maintaining the height of the contact.

According to a further aspect of the present invention, there is provided a method of scaling an electrical connector so as to maintain a generally constant near end cross-talk and characteristic impedance. The method comprises providing a number of contacts, each having a length, a width, and a height that define a volume, the contacts being manufactured to a tolerance; separating the plurality of contacts by a pitch (P); fixing three of the number of contacts, the length, the width, the height, the volume and the tolerance; and adjusting the remaining three of the number of contacts, the length, the width, the height, the volume and the tolerance. The fixing step may comprise fixing the width, the height and the number of contacts and the adjusting step may comprise adjusting the tolerance, the length and the volume.

According to a yet another aspect of the present invention, there is provided an electrical connector system that includes a first electrical connector comprising a contact formed of metalized silicon and a base supporting the contact, and a second electrical connector mateable with the first electrical connector that comprises a contact formed of metalized silicon and a base supporting the contact.

Other features and aspects will be described below.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings an embodiment that is presently preferred, in which like references numerals represent similar parts throughout the several views of the drawings, it being understood, however, that the invention is not limited to the specific methods and instrumentalities disclosed. In the drawings:

FIG. 3 illustrates a perspective view of another alternative embodiment of an interconnect structure of the present invention;

FIG. 4 illustrates a sectional view of the interconnect structure of FIG. 3 taken along line Z—Z, and an electrical element which is received by the interconnect structure;

FIG. 5 illustrates a front view of a cantilever beam;

DETAILED DESCRIPTION OF THE PREFERRED EMBODIMENTS

The present invention is directed to an interconnect structure providing a very high density of connection points (pin count) that overcomes the above-noted limitations in the prior art. In order to provide for a high number of connection points, the interconnect of the present invention utilizes cantilever beams preferably made micromachined silicon. Micromachined silicon beams are used because they can be advantageously fabricated to almost zero mechanical tolerances, thus reducing the required beam compliance and volume for a particular application. Further, if an insulating silicon beam and plug structure is used that is selective metalized to from a plug pad/beam contact system, the electrical constraints can be effectively uncoupled from the mechanical constraints to yield a more flexible interconnect design, as will be described below.

I. Design Constraints

Figure 1:
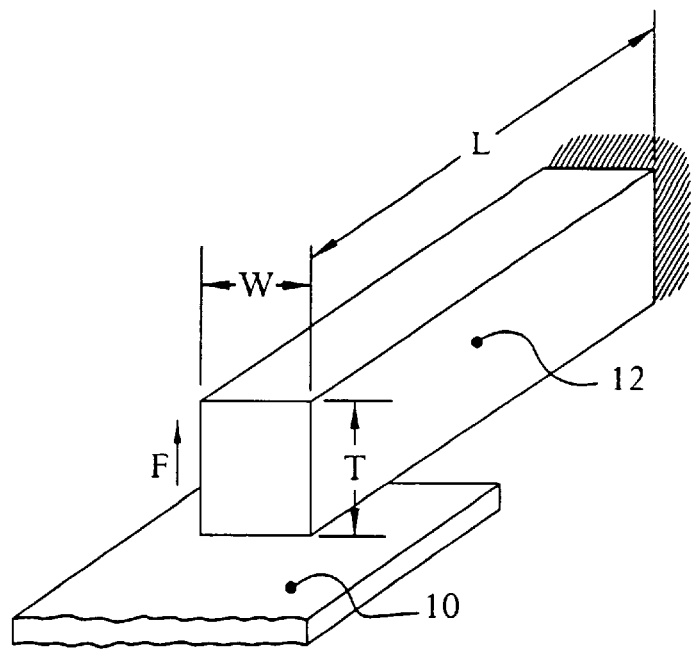
FIG. 1 is a perspective view illustrating one alternative embodiment in which a portion of a cantilever beam contacting a terminal pad.
Figure 2:
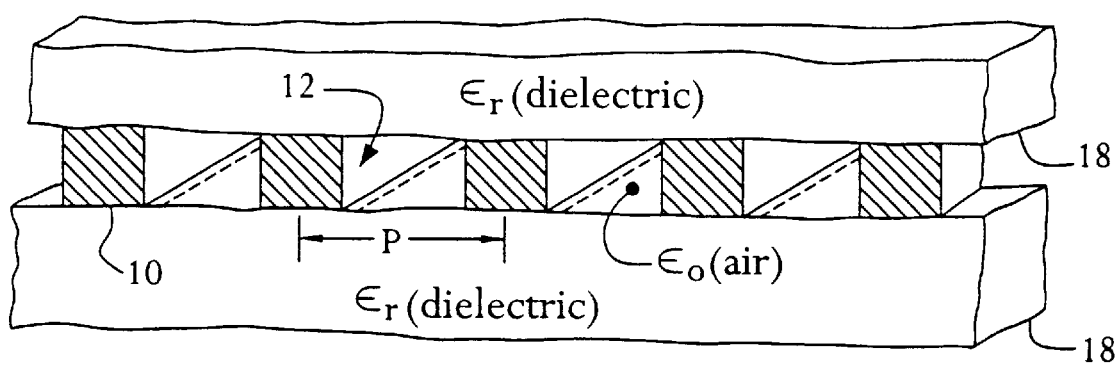
FIG. 2 is a perspective view illustrating another alternative embodiment in which a plurality of cantilever beams disposed between dielectric layers of an electrical element.

The following discussion of the design constraints and scaling rules associated with fabricating the interconnect structure of the present invention having silicon cantilever beams will be made with reference to FIGS. 1 and 2. As is well known in the art, a cantilever beam structure is an elongated structure that is fixed at one end and the other end is free to move, typically in response to a force acting generally transverse to the longitudinal axis of the elongate element. FIG. 1 illustrates a perspective view of a cantilever beam 12 contacting a contact terminal pad 10. FIG. 2 illustrates a plurality of beams 12 contacting terminal pads (not shown) formed on an electrical element 18. The beams 12 are separated by air having a dielectric constant of $\epsilon_0$ and the electrical element 18 has a dielectric constant of $\epsilon_r$.

As shown in FIGS. 1 and 2, an interconnect structure having cantilever beams 12 is intended to make pressure contact with terminal pads 10 of an electrical element 18. Thus, the cantilever beams 12 act as springs or spring elements and experience a contact force F that is created when in contact with the terminal pads 10. Generally, a minimum contact force F is desired to effect reliable pressure contact to electronic components (e.g., to terminals on electronic components). For example, a contact force F between approximately 2 grams and 150 grams or more, per contact may be desired to ensure that a reliable electrical connection is made to a terminal 10 of an electrical element 18. The contact force F on the beam for any given beam material must remain constant even as the beam 12 is scaled down for smaller contact pitches P. To achieve this, either the yield strength of the beam material or that the size of the beam 12 must be increased. However, manufacturing processes become more difficult with the higher yield strength material. Further, increased beam size is counter to the industry trend of making the beams smaller. In addition, the compliance or spring rate required in an interconnect structure is set by a generally fixed tolerance range.

The above can be described mathematically. For a cantilever beam 12 having a length L a contact force F applied at a distance x from the free end, the beam 12 will deflect according to the relationship:

$$y = \frac{1}{6}\frac{F}{EI}(x^3 - 3L^2x + 2L^3) \qquad (1)$$

wherein E is the modulus of elasticity and I is the second moment of inertia. The maximum deflection of the cantilever beam 12 is defined by:

$$y_{max} = \frac{1}{3}\frac{FL^3}{EI} \qquad (2)$$

which occurs when the load F is at a terminal end of the cantilever beam 12.

Thus, from equation (1), the mechanical system constraints for beam contact interconnects are dictated by the transverse tolerances. Particularly, the lateral tolerances fix maximum number of lines (e.g., pin-outs) over the width d of the interconnect land and serves as a registration constraint. The vertical tolerances $\epsilon$ fix the spring rate of the cantilever beam 12 and the beam volume $V_b$ to be:

$$V_b = \frac{9EF_M^2}{\tau_{xx}^2}\left(\frac{\epsilon d}{\Delta f}\right) \qquad (3)$$

However, a particular cantilever beam interconnect design must also account for electrical constraints in addition to the mechanical constraints. Electrical performance is dictated by a combination of $Z_0$ (characteristic impedance), crosstalk, time delay, and material properties. The electrical constraints may be simplified by specifying a design wherein only the contact width W and pitch P are variable. Accordingly, a normalized beam equation may be calculated and a characteristic length $L_e$ for the beam contact system may be defined as follows:

$$L_e \sim \left(\frac{F_m^3 E}{\Delta f \tau_{xx}^3}\right)^{1/4} \quad (4)$$

wherein, F is the maximum contact force of the beam, E is the modulus of elasticity, $\Delta f$ is the free load of the beam 12, and $\tau$ is the shear stress. The characteristic length $L_e$ is related to the contact force F and accounts for the tolerances of the interconnect design, the electrical constraints, and the mechanical properties of the beam material. Further, the characteristic length $L_e$ is an absolute scale length for the pitch P and serves to set a minimum pitch P of the interconnect structure. For example, an elastic beryllium copper beam cable of producing a contact force F of 100 grams yields a pitch scale length of approximately 4 mils. If the beam material is Phros Bronze, then characteristic length $L_e$ is approximately 3–4 mils. For silicon, the length $L_e$ would be considerably smaller.

To overcome the above-identified mechanical and electrical performance constraints, there are several possible solutions. A first option is to use a more efficient beam design. However, if the beam geometry is already an efficient design, this option is not a feasible solution. A second option is to use a beam material that can be elastically operated at higher bending stresses. This option reduces both the required beam volume and the pitch scale length. A third option is to select materials that will reduce the tolerances that the beams must accommodate. Lastly, a fourth option is to uncouple the mechanical and electrical performance constraints by using a contact system which is independent from the beam system.

Silicon is the preferred beam material because it allows a designer to efficiently implement the third and fourth options described above in an interconnect structure. In particular, a mating plug system fabricated from silicon can be made to almost zero tolerances, therefore, the beams need only match mating alignment tolerances. The fourth option is applicable in an insulating silicon plug substrate/beam system which is selectively metalized to form the plug pad/beam contact system. It is noted that the second option is applicable if the silicon beam can be operated at the maximum possible bending stress. However, surface imperfections and local stress concentrations typically dictate using an average bending stress value far below the maximum possible bending stress.

In view of the above, certain mechanical and electrical scaling rules can be defined for scaling silicon cantilever beams used within the interconnect structure. These rules are detailed in Tables I and II below. Parameters identified by a "*" are fixed constraints and those identified by a "**" are variable constraints. Table I details the mechanical constraints in order to maintain a fixed tolerance in a system wherein other beam parameters are proportionally fixed to pitch P.

TABLE I

| Varied Beam Parameters | Proportional Relationship | Proportional Relationship |
|---|---|---|
| Tolerance ($\epsilon$) | 1* | 1* |
| Width (W) | P* | $\frac{1}{P^{2/3}}$ |
| Thickness (T) | $\frac{1}{P^{2/3}}$ | P* |
| Length (L) | $\frac{1}{P^{1/3}}$ | $\frac{1}{P^{1/3}}$ |
| Number of Contacts (N) | $\frac{1^*}{P}$ | $\frac{1^*}{P}$ |
| Beam Volume ($V_b$) | 1 | 1 |

Note:
*denotes a fixed parameter
**denotes a variable parameter

In the first scenario (displayed in the second column), the tolerance ($\epsilon$), the width (W) and the number of contacts (N) are held constant. The thickness (T), therefore, will vary proportional to $$\frac{1}{P^{2/3}}$$

and the length (L) will vary proportional to $$\frac{1}{P^{1/3}}.$$

In the second scenario (displayed in the third column), the tolerance, the thickness and the number of contacts are held constant. The width, therefore, will vary proportional to $$\frac{1}{P^{2/3}}$$

and the length will vary proportional to $$\frac{1}{P^{1/3}}.$$

Thus, as can be understood from Table I, to obtain an interconnect structure having a higher density of connection points, the particular contact cantilever beam 12 design must be scaled down to achieve a smaller contact pitch P. However, the beam volume $V_b$ (equal to W*T*L) and tolerances must remain constant as the pin count increases (i.e., the pitch P decreases). This implies that, as the contact beam width W is decreased for the smaller pitch, the beam height T and length L must increase accordingly in order to maintain a constant volume $V_b$. Eventually, the required increase in contact beam height T and length L adversely affects the electrical performance (e.g. crosstalk and propagation delay) of the interconnect structure.

While the scaling rules of Table I will maintain a fixed mechanical tolerance, they do not account for the electrical performance of a silicon cantilever beam, which are defined by Table II. The second and third columns of Table II define two relationships, maintaining a constant zero rise time near end crosstalk (NEXT), and a constant characteristic impedance. The fourth column of Table II illustrates the rules to maintain a constant (finite) rise time near end crosstalk (NEXT), and a constant characteristic impedance.

As an example, referring to the second column, to maintain constant crosstalk for a pitch P, the width W and thickness T must vary proportionally to the pitch P, whereas the length L must vary proportionally to $P^3$. Referring to the third column, to maintain constant impedance and near-end cross talk for a pitch P, the width W and thickness T must vary proportionally to the pitch P, whereas the tolerances must vary proportionally to $P^5$. As defined in the fourth column, to maintain a constant finite rise time near end crosstalk for a pitch P, the width W must vary proportionally to the pitch P, whereas the thickness T and number of contacts N must vary proportionally to $1/P^{1/2}$.

TABLE II

| Constant | $Z_0$, Next at Zero Risetime | $Z_0$, Next at Rise Time ($T_r$) > Delay Time ($T_d$) |
|---|---|---|
| Tolerances ε | 1** | $P^5$ | 1* |
| Characteristic Impedance $Z_0$ | 1* | 1* | ~1* |
| NEXT | 1* | 1* | ~1* |
| Width W | P* | P* | P* |
| Thickness T | P* | P* | $\frac{1}{P^{1/2}}$ |
| Length L | $P^3$ | $P^3$ | 1** |
| Number of Contacts N | $P^4$ | $\frac{1}{P^{**}}$ | $\frac{1}{P^{1/2}}$ |
| Beam Volume $V_b$ | $P^5$ | $P^5$ | $P^{1/2}$ |

Note:
*denotes a fixed parameter
**denotes a variable parameter

II. Structural Implementation

Referring now to FIGS. 3–6, there is illustrated an example of a micromachined high compliance silicon beam interconnect structure 13 in accordance with the present invention that implements the above constraints. The interconnect structure 13 may be connected to a printed circuit board (not shown) or other electrical component to connect various electrical elements.

As illustrated in FIG. 3, the interconnect structure 13 includes a plurality of cantilever beams 12 in two generally parallel planes, each having a predetermined pitch P. As noted above, the cantilever beams 12 are preferably made from silicon. The planes of cantilever beams 12 are separated by a suitable dielectric material 14 used to form a recessed region 17 between the rows of cantilever beams 12. Slots 15 are formed in a mounting structure 16 that is disposed on the top and bottom of the dielectric material 14, and within which the cantilever beams 12 are secured. These slots 15 may be used to position and fasten the interconnect structure 13 to the printed circuit board or other electrical component.

Figure 6:
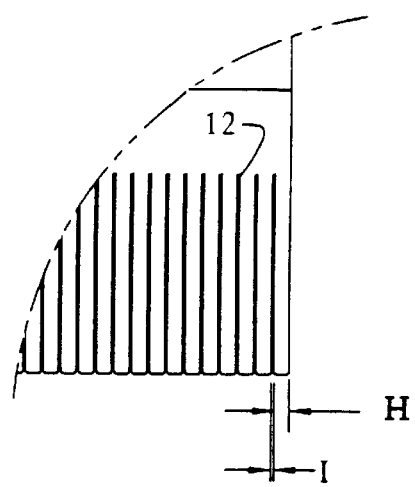
FIG. 6 illustrates a top view of the interconnect structure of FIG. 3.

As illustrated in FIGS. 3 and 6, the exemplary interconnect structure 13 could have a length of 1.25 inches (Dimension A) which includes 100 beams on centers of approximately 0.010" (Dimension B). Each beam 12 could have a width of approximately 0.008 inches (Dimension H) and adjacent beams area separated by a gap of approximately 0.002 inches (Dimension I). Peripheral areas 11 are provided at each end of the interconnect structure 13, and have a length of approximately 0.13 inches, respectively (Dimension C).

Referring to FIG. 4, there is illustrated a cross-section taken along line Z—Z of FIG. 3. FIG. 4 particularly illustrates that the rows of cantilever beams 12 are adapted to contact another electrical element 18 when the electrical element 18 is inserted therein between. When the electrical element 18 is inserted into the recessed region 17, a contact force F is created against the cantilever beams 12 by terminal pad 10 to place the cantilever beams 12 in electrical communication with a respective terminal pad 10 of the electrical element 18. The terminal pads 10 also preferably comprise metalized silicon. Thus, the cantilever beams 12 will deflect in response to an applied contact force F.

The deflection of the cantilever beam 12 is determined in part by the overall shape of the cantilever beam 12, an example of which is illustrated in FIG. 5. FIG. 5 is a frontal view of the cantilever beam 12 showing the preferred structural shape thereof. The beam 12 has top surface 12A having a width of approximately 0.0018 inches (Dimension Q). Each side 12B is formed by a pair of surfaces 12C/12D. Surfaces 12C are formed at a predetermine angle α with respect to the top surface 12A, which is preferably approximately 54.74°. The vertical height of surface 12C is preferably approximately 0.0044 inches (Dimension F) and the overall vertical height of the side 12B of the cantilever beam 12 is approximately 0.0072 inches (Dimension G). The bottom surface 12E preferably serves as a contact surface to mate with, e.g., the terminal 10 on electrical element 18. The bottom surface 12E has a width of approximately 0.0040 inches (Dimension D). It is preferable to form each of the surfaces on the cantilever beam 12 using known micromachining techniques. Furthermore, the metalization is accomplished using known techniques.

Figure 7:
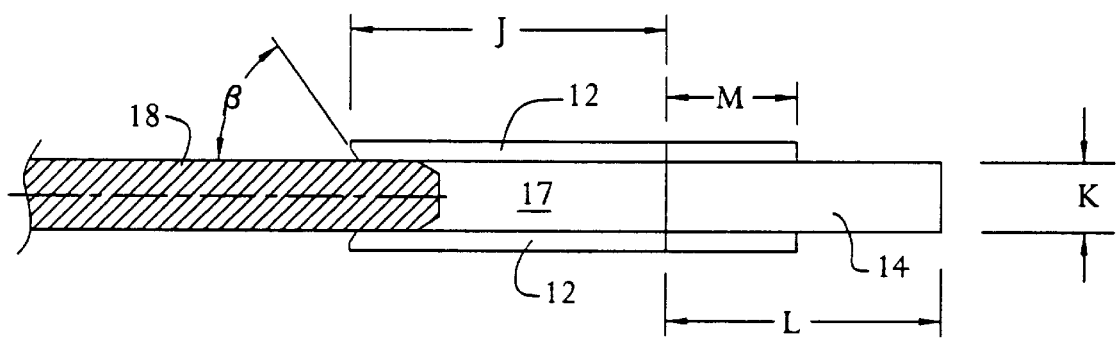
FIG. 7 illustrates the view of FIG. 4 in greater detail.

FIG. 7 illustrates in more detail a side view of the interconnect structure 13 of FIG. 3 having the electrical element 18 partially inserted therein. In order for the electrical element 18 to easily mate with the interconnect structure 10, it is preferable to provide the receiving portion of the cantilever beam 12 with a lead-in surface sloped at an angle β, which is preferably approximately 54°40'. The cantilever beams 12 extend outward from the dielectric material a distance of approximately 0.113 inches (Dimension J). The fixed end of the cantilever beam 12 is attached to the dielectric material 14 over a distance of approximately 0.047 inches (Dimension M). As shown, the distance between the rows of cantilever beams 12 formed by the dielectric material 14 is approximately 0.025 inches (Dimension K) and the dielectric material has a length of approximately 0.1 inches (Dimension L).

Thus, the present invention provides for a novel interconnect system that may be used to provide electrical connections between devices. The present invention may be scaled to different dimensions while maintaining predetermined mechanical and/or electrical characteristics. It is noted that the present invention may be employed in other specific forms without departing from the spirit or essential attributes thereof. While the invention has been described and illustrated with reference to specific embodiments, those skilled in the art will recognize that modification and variations may be made without departing from the principles of the invention as described herein above and set forth in the following claims.

What is claimed:

1. An interconnect structure adapted to receive an electrical component, comprising:
   a dielectric material; and
   a plurality of cantilever beams secured to said dielectric material and comprising silicon, said cantilever beams having a predetermined pitch P,
   wherein said plurality of cantilever beams are deflected by a contact force created when said plurality of cantilever beams receive said electrical component to place said cantilever beams in mechanical and electrical communication with said electrical component, and
   wherein when a width of each of said plurality of cantilever beams is decreased when said pitch is decreased, and wherein a height and length of each of said plurality of cantilever beams is increased to maintain a constant volume of each of said plurality of cantilever beams.

2. The interconnect structure as recited in claim 1, wherein said contact force remains constant when said pitch is decreased.

3. An interconnect structure adapted to receive an electrical component, comprising:
   a dielectric material; and
   a plurality of cantilever beams secured to said dielectric material and comprising silicon, said cantilever beams having a predetermined pitch P,
   wherein said plurality of cantilever beams are deflected by a contact force created when said plurality of cantilever beams receive said electrical component to place said cantilever beams in mechanical and electrical communication with said electrical component, and
   wherein lateral tolerances of said plurality of cantilever beams fix a minimum pitch and vertical tolerances of said plurality of cantilever beams fix a spring rate of said cantilever beams.

4. The interconnect structure as recited in claim 3, wherein if a width of said plurality of cantilever beams is varied proportionally to said pitch P, then a thickness of said plurality of cantilever beams varies proportionally to $1/P^{2/3}$.

5. The interconnect structure as recited in claim 3, wherein if the thickness of said plurality of cantilever beams is varied proportionally to the pitch P, a width of said plurality of cantilever beams varies proportionally to $1/P^{2/3}$.

6. The interconnect structure as recite in claim 3, wherein a length of said plurality of cantilever beams varies proportionally to $1/P^{1/3}$.

7. An interconnect structure adapted to receive an electrical component, comprising:
   a dielectric material; and
   a plurality of cantilever beams secured to said dielectric material and comprising silicon, said cantilever beams having a predetermined pitch P,
   wherein said plurality of cantilever beams are deflected by a contact force created when said plurality of cantilever beams receive said electrical component to place said cantilever beams in mechanical and electrical communication with said electrical component, and
   wherein electrical constraints of said plurality of cantilever beams are determined by at least one of characteristic impedance, crosstalk, time delay, and material properties.

8. The interconnect structure as recited in claim 7, wherein to maintain constant crosstalk or to maintain constant impedance and near-end cross talk for varying values of said pitch P, a width and thickness of said plurality of cantilever beams is varied proportionally to said pitch P, and a length of said plurality of cantilever beams is varied proportionally to $P^3$.

9. The interconnect structure as recited in claim 8, wherein to maintain constant impedance and near-end cross talk for varying values of said pitch P, a tolerance of said plurality of cantilever beams varies proportionally to $P^5$.

10. The interconnect structure as recited in claim 8, wherein to maintain a constant zero rise time for varying values of said pitch P, a width is varied proportionally to said pitch P, and a thickness and a number of contacts varies proportionally to $1/P^{1/2}$.

11. An interconnect structure adapted to receive an electrical component, comprising:
    a dielectric material; and
    a plurality of cantilever beams secured to said dielectric material and comprising silicon, said cantilever beams having a predetermined pitch P,
    wherein said plurality of cantilever beams are deflected by a contact force created when said plurality of cantilever beams receive said electrical component to place said cantilever beams in mechanical and electrical communication with said electrical component,
    wherein each of said plurality of cantilever beams has a top surface, a side comprising first and second side surfaces, and a bottom surface, wherein said bottom surface contacts a terminal pad of said electrical component when received by said interconnect structure,
    wherein said first side surface is formed at a predetermine angle with respect to said top surface, and
    wherein said predetermined angle is approximately 54.74°.

12. An interconnect structure adapted to receive an electrical component, comprising:
    a dielectric material; and
    a plurality of cantilever beams secured to said dielectric material and comprising silicon, said cantilever beams having a predetermined pitch P,
    wherein said plurality of cantilever beams are deflected by a contact force created when said plurality of cantilever beams receive said electrical component to place said cantilever beams in mechanical and electrical communication with said electrical component,
    wherein each of said plurality of cantilever beams has a top surface, a side comprising first and second side surfaces, and a bottom surface, wherein said bottom surface contacts a terminal pad of said electrical component when received by said interconnect structure,
    wherein each of said plurality of cantilever beams has a sloped face at a free end thereof, and
    wherein said sloped face is formed at an angle of approximately 54°40'.

13. An interconnect structure comprising:
    a dielectric material;
    a plurality of cantilever beams made from silicon an having a predetermined pitch P secured to said dielectric material and arranged in two generally parallel rows;
    wherein said two generally parallel planes are separated by said dielectric material to form a recessed region between said two generally parallel planes,
    wherein a contact force is created when said plurality of cantilever beams receive an electrical component to place said cantilever beams in mechanical and electrical communication with said electrical component wherein each of said plurality of cantilever beams has a top surface, a side comprising first and second side surfaces, and a bottom surface, wherein said bottom surface contacts a terminal pad of said electrical component when received by said interconnect structure, and wherein said first side surface is formed at an angle of approximately 54.74° with respect to said top surface.

14. An interconnect structure comprising:

a dielectric material;

a plurality of cantilever beams made from silicon an having a predetermined pitch P secured to said dielectric material and arranged in two generally parallel rows;

wherein said two generally parallel planes are separated by said dielectric material to form a recessed region between said two generally parallel planes, wherein a contact force is created when said plurality of cantilever beams receive an electrical component to place said cantilever beams in mechanical and electrical communication with said electrical component wherein each of said plurality of cantilever beams has a top surface, a side comprising first and second side surfaces, and a bottom surface, wherein said bottom surface contacts a terminal pad of said electrical component when received by said interconnect structure, and wherein each of said plurality of cantilever beams has a sloped face at a free end thereof, said sloped surface being formed at an angle of approximately 54°40'.

15. A micromachined beam for use in an electrical interconnect, comprising:

a top surface;

a side surface; and a bottom surface, wherein said side surface is formed at a predetermined angle with respect to said top surface, wherein said bottom surface is adapted to electrically communicate with an electrical component received by said electrical interconnect, and wherein said predetermined angle is approximately 54.74°.

16. A micromachined beam for use in an electrical interconnect, comprising:

a top surface;

a side surface; and a bottom surface, wherein said side surface is formed at a predetermined angle with respect to said top surface, wherein said bottom surface is adapted to electrically communicate with an electrical component received by said electrical interconnect, wherein said micromachined beam has a sloped face at an end thereof, and wherein said sloped face is formed at an angle of approximately 54°40'.

* * * * *

UNITED STATES PATENT AND TRADEMARK OFFICE
CERTIFICATE OF CORRECTION

PATENT NO.    : 6,361,327 B1
DATED         : March 26, 2002
INVENTOR(S)   : Richard A. Elco et al.

It is certified that error appears in the above-identified patent and that said Letters Patent is hereby corrected as shown below:

Column 2,
Line 34, please delete the word "maybe" and insert the words -- may be. --

Column 3,
Line 63, please delete the word "selective" and insert the word -- selectively. --
Line 64, please delete the word "from" and insert the word -- form. --

Column 9,
Line 46, please delete the word "recite" and insert the word -- recited. --

Column 10,
Line 30, please delete the word "predetermine" and insert the word -- predetermined. --
Line 56, please delete the word "an" and insert -- and. --

Column 11,
Line 13, please delete the word "an" and insert -- and. --

Signed and Sealed this

Thirtieth Day of July, 2002

*Attest:*

*Attesting Officer*

JAMES E. ROGAN
*Director of the United States Patent and Trademark Office*